United States Patent
Yau et al.

(10) Patent No.: US 7,651,725 B2
(45) Date of Patent: Jan. 26, 2010

(54) LOW DIELECTRIC CONSTANT FILM PRODUCED FROM SILICON COMPOUNDS COMPRISING SILICON-CARBON BOND

(75) Inventors: Wai-Fan Yau, Mountain View, CA (US);
David Cheung, Foster City, CA (US);
Shin-Puu Jeng, Cupertino, CA (US);
Kuowei Liu, Santa Clara, CA (US);
Yung-Cheng Yu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/923,037

(22) Filed: Oct. 24, 2007

(65) Prior Publication Data

US 2008/0044557 A1  Feb. 21, 2008

Related U.S. Application Data

(63) Continuation of application No. 10/756,122, filed on Jan. 13, 2004, which is a continuation of application No. 09/477,126, filed on Dec. 30, 1999, now abandoned, which is a continuation of application No. 09/021,788, filed on Feb. 11, 1998, now Pat. No. 6,054,379.

(51) Int. Cl.
*B05D 5/12* (2006.01)
*H01L 21/4763* (2006.01)

(52) U.S. Cl. .................. 427/97.7; 438/643; 438/653

(58) Field of Classification Search ............... 427/96.1, 427/97.7; 438/643, 653
See application file for complete search history.

(56) References Cited

U.S. PATENT DOCUMENTS

| 4,168,330 | A |   | 9/1979  | Kaganowicz           |
|-----------|---|---|---------|----------------------|
| 4,557,946 | A |   | 12/1985 | Sacher et al.        |
| 4,599,243 | A | * | 7/1986  | Sachdev et al. ...... 216/18 |
| 4,717,585 | A |   | 1/1988  | Ishihara et al.      |

(Continued)

FOREIGN PATENT DOCUMENTS

DE    4404690    8/1995

(Continued)

OTHER PUBLICATIONS

Y.S. Lin, et al. "Plasma Polymerization of Trimethylsilane in Cascade Arc Discharge" Department of Chemical Engineering, and Center for Surface Science and Plasma Technology, University of Missouri-Columbia, Feb. 4, 1997, pp. 1653-1665.

(Continued)

*Primary Examiner*—Brian K Talbot
(74) *Attorney, Agent, or Firm*—Patterson & Sheridan

(57) ABSTRACT

A method and apparatus for depositing a low dielectric constant film by reaction of an organo silane compound and an oxidizing gas. The oxidized organo silane film has excellent barrier properties for use as a liner or cap layer adjacent other dielectric layers. The oxidized organo silane film can also be used as an etch stop or an intermetal dielectric layer for fabricating dual damascene structures. The oxidized organo silane films also provide excellent adhesion between different dielectric layers. A preferred oxidized organo silane film is produced by reaction of methyl silane, $CH_3SiH_3$, and $N_2O$.

6 Claims, 9 Drawing Sheets

U.S. PATENT DOCUMENTS

| | | | |
|---|---|---|---|
| 4,789,648 A | 12/1988 | Chow et al. | |
| 4,798,629 A | 1/1989 | Wood et al. | |
| 4,812,325 A | 3/1989 | Ishihara et al. | |
| 4,824,690 A | 4/1989 | Heinecke et al. | |
| 4,828,880 A | 5/1989 | Jenkins et al. | |
| 4,842,888 A | 6/1989 | Haluska et al. | |
| 4,845,054 A | 7/1989 | Mitchener | |
| 4,894,352 A | 1/1990 | Lane et al. | |
| 4,900,591 A | 2/1990 | Bennett et al. | |
| 4,973,511 A | 11/1990 | Farmer et al. | |
| 4,981,724 A | 1/1991 | Hochberg et al. | |
| 5,000,113 A | 3/1991 | Wang et al. | |
| 5,028,566 A | 7/1991 | Lagendijk | |
| 5,040,046 A | 8/1991 | Chhabra et al. | |
| 5,087,959 A | 2/1992 | Omori et al. | |
| 5,093,153 A | 3/1992 | Brochot et al. | |
| 5,120,680 A | 6/1992 | Foo et al. | |
| 5,124,014 A | 6/1992 | Foo et al. | |
| 5,156,881 A | 10/1992 | Okano et al. | |
| 5,182,000 A | 1/1993 | Antonelli et al. | |
| 5,204,141 A | 4/1993 | Roberts et al. | |
| 5,208,069 A | 5/1993 | Clark et al. | |
| 5,224,441 A | 7/1993 | Felts et al. | |
| 5,246,887 A | 9/1993 | Yu | |
| 5,250,473 A | 10/1993 | Smits et al. | |
| 5,279,867 A | 1/1994 | Friedt et al. | |
| 5,284,730 A | 2/1994 | Takei et al. | |
| 5,290,736 A | 3/1994 | Sato et al. | |
| 5,298,587 A | 3/1994 | Hu et al. | |
| 5,314,724 A | 5/1994 | Tsukune et al. | |
| 5,360,646 A | 11/1994 | Morita et al. | |
| 5,362,526 A | 11/1994 | Wang et al. | |
| 5,364,666 A | 11/1994 | Williams et al. | |
| 5,465,680 A | 11/1995 | Loboda | |
| 5,468,520 A | 11/1995 | Williams et al. | |
| 5,482,984 A | 1/1996 | Chetcuti et al. | |
| 5,488,015 A | 1/1996 | Havemann et al. | |
| 5,492,736 A | 2/1996 | Laxman et al. | |
| 5,494,712 A | 2/1996 | Hu et al. | |
| 5,508,368 A | 4/1996 | Knapp et al. | |
| 5,510,105 A | 4/1996 | Strom | |
| 5,525,550 A | 6/1996 | Kato et al. | |
| 5,530,581 A | 6/1996 | Cogan | |
| 5,552,344 A * | 9/1996 | Jang et al. | 438/624 |
| 5,554,570 A * | 9/1996 | Maeda et al. | 438/763 |
| 5,559,367 A | 9/1996 | Cohen et al. | |
| 5,563,105 A | 10/1996 | Dobuzinsky et al. | |
| 5,578,523 A | 11/1996 | Fiordalice et al. | |
| 5,593,741 A | 1/1997 | Ikeda et al. | |
| 5,598,027 A | 1/1997 | Matsuura et al. | |
| 5,599,740 A | 2/1997 | Jang et al. | |
| 5,610,105 A | 3/1997 | Vines et al. | |
| 5,616,369 A | 4/1997 | Williams et al. | |
| 5,618,619 A | 4/1997 | Petrmichl et al. | |
| 5,637,351 A | 6/1997 | O'Neal et al. | |
| 5,638,251 A | 6/1997 | Goel et al. | |
| 5,679,413 A | 10/1997 | Petrmichl et al. | |
| 5,683,940 A | 11/1997 | Yahiro et al. | |
| 5,693,563 A | 12/1997 | Teong et al. | |
| 5,693,928 A * | 12/1997 | Egitto et al. | 204/157.15 |
| 5,698,901 A | 12/1997 | Endo et al. | |
| 5,700,720 A | 12/1997 | Hashimoto et al. | |
| 5,703,404 A | 12/1997 | Matsuura et al. | |
| 5,718,967 A | 2/1998 | Hu et al. | |
| 5,739,579 A | 4/1998 | Chiang et al. | |
| 5,753,364 A | 5/1998 | Rutherford et al. | |
| 5,753,564 A | 5/1998 | Fukada | |
| 5,780,338 A | 7/1998 | Jeng et al. | |
| 5,789,319 A | 8/1998 | Havemann et al. | |
| 5,800,877 A | 9/1998 | Maeda et al. | |
| 5,807,785 A | 9/1998 | Ravi | |
| 5,817,572 A | 10/1998 | Chiang et al. | |
| 5,821,168 A | 10/1998 | Jain | |
| 5,827,785 A | 10/1998 | Bhan et al. | |
| 5,834,162 A | 11/1998 | Malba | |
| 5,858,880 A | 1/1999 | Dobson et al. | |
| 5,874,367 A | 2/1999 | Dobson et al. | |
| 5,888,593 A | 3/1999 | Petrmichl et al. | |
| 5,891,799 A | 4/1999 | Tsui et al. | |
| 5,942,802 A | 8/1999 | Aoi | |
| 5,946,593 A | 8/1999 | Saitoh et al. | |
| 5,970,376 A | 10/1999 | Chen et al. | |
| 5,989,338 A | 11/1999 | DeBoer et al. | |
| 5,989,998 A | 11/1999 | Sugahara et al. | |
| 6,051,321 A | 4/2000 | Lee et al. | |
| 6,054,206 A | 4/2000 | Mountsier | |
| 6,054,379 A | 4/2000 | Yau et al. | |
| 6,068,884 A | 5/2000 | Rose et al. | |
| 6,072,227 A | 6/2000 | Yau et al. | |
| 6,124,641 A | 9/2000 | Matsuura et al. | |
| 6,140,226 A | 10/2000 | Grill et al. | |
| 6,147,009 A | 11/2000 | Grill et al. | |
| 6,150,252 A * | 11/2000 | Hsu et al. | 438/597 |
| 6,150,725 A | 11/2000 | Misawa et al. | |
| 6,159,871 A | 12/2000 | Loboda et al. | |
| 6,207,585 B1 | 3/2001 | Hasegawa et al. | |
| 6,242,366 B1 | 6/2001 | Beekman et al. | |
| 6,287,990 B1 | 9/2001 | Cheung et al. | |
| 6,316,167 B1 | 11/2001 | Angelopoulos et al. | |
| 6,348,421 B1 | 2/2002 | Shu et al. | |
| 6,514,667 B2 | 2/2003 | Angelopoulos et al. | |
| 6,593,655 B1 | 7/2003 | Loboda et al. | |
| 2005/0051900 A1 | 3/2005 | Liu et al. | |

FOREIGN PATENT DOCUMENTS

| | | |
|---|---|---|
| DE | 19654737 | 7/1997 |
| DE | 19804375 | 1/1999 |
| DE | 19904311 | 8/1999 |
| EP | 0289402 | 11/1988 |
| EP | 0469926 | 2/1992 |
| EP | 0519079 | 12/1992 |
| EP | 0522799 | 1/1993 |
| EP | 0533129 | 3/1993 |
| EP | 0589678 | 3/1994 |
| EP | 0711817 | 5/1996 |
| EP | 0721019 | 7/1996 |
| EP | 0743675 | 11/1996 |
| EP | 0771886 | 5/1997 |
| EP | 0774533 | 5/1997 |
| EP | 0840365 | 5/1998 |
| EP | 0849374 | 6/1998 |
| EP | 0849789 | 6/1998 |
| EP | 0926715 | 6/1999 |
| EP | 0926724 | 6/1999 |
| EP | 0935283 | 8/1999 |
| EP | 0960958 | 12/1999 |
| EP | 1123991 | 8/2001 |
| GB | 2015983 | 9/1979 |
| GB | 2316535 | 2/1998 |
| JP | 59098726 | 6/1984 |
| JP | 59222659 | 12/1984 |
| JP | 60111480 | 6/1985 |
| JP | 64050429 | 2/1989 |
| JP | 05267480 | 10/1993 |
| JP | 06-168930 | 6/1994 |
| JP | 06163521 | 6/1994 |
| JP | 06168937 | 6/1994 |
| JP | 07-029897 | 1/1995 |
| JP | 08222559 | 8/1996 |
| JP | 08236518 | 9/1996 |
| JP | 08279505 | 10/1996 |
| JP | 08288286 | 11/1996 |
| JP | 09008031 | 1/1997 |

| | | |
|---|---|---|
| JP | 09064029 | 3/1997 |
| JP | 09237785 | 9/1997 |
| JP | 09251997 | 9/1997 |
| JP | 09260369 | 10/1997 |
| JP | 10242143 | 9/1998 |
| JP | 10-313003 | 11/1998 |
| JP | 11-008237 | 1/1999 |
| JP | 11-054504 | 2/1999 |
| JP | 11251293 | 9/1999 |
| JP | 2000-049157 | 2/2000 |
| WO | WO-9212535 | 7/1992 |
| WO | WO-9401885 | 1/1994 |
| WO | WO-9859089 | 12/1998 |
| WO | WO-9938202 | 7/1999 |
| WO | WO-9941423 | 8/1999 |
| WO | WO-9955526 | 11/1999 |
| WO | WO-9963591 | 12/1999 |
| WO | WO-0001012 | 1/2000 |

OTHER PUBLICATIONS

W. D. Brown "Dielectric Material Integration for Microelectronics" Dielectric Science and Technology and Electronics Divisions Proceedings vol. 98-3, 8 pages.

A. Grill, et al. "Diamondlike Carbon Materials as Low-k Dielectrics" 1997 Materials Research Society, pp. 417-423.

A.M. Wrobel, et al. "Reactivity of Alkylsilanes and Alkylcarbosilanes in Atomic Hydrogen-Induced Chemical Vapor Deposition" Polish Academy of Sciences, Centre of Molecular and Macromolecular Studies, 90-363 Lodz, Poland, pp. 1060-1065.

Laura Peters, "Pursuing the Perfect Low-K Dielectric" 64 Semiconductor International, Sep. 1998, 7 pages.

G. Sugahara, et al. "Low Dielectric Constant Carbon Containing $SiO_2$ Films Deposited by PECVD Technique Using a Novel CVD Precursor" Feb. 10-11, 1997 DUMIC Conference, 1997 ISMIC—222D/97/0019, pp. 19-25.

M.J. Loboda, et al. "Deposition of Low-k Dielectric Films Using Trimethylsilane" Electrochemical Society Proceedings vol. 98-6, pp. 145-152.

S. McClatchie, "Low Dielectric Constant Oxide Films Deposited Using CVD Techniques" Feb. 16-17, 1998 DUMIC Conference 1998 IMIC—333D/98/0311 pp. 311-318.

A. Grill and V. Patel "Low Dielectric Constant Films Prepared by Plasma-enhanced Chemical Vapor Deposition from Tetramethylsilane" IBM-Research Division, T.J. Watson Research Center, Yorktown Heights, New York 10598, pp. 3314-3318.

A. Grill, V. Patel and C. Jahnes "Novel Low-K Dielectrics Based on Diamondlike Carbon Materials" IBM, Research Division, T.J. Watson Research Center, Yorktown Heights, New York 10598, USA, pp. 1649-1653.

PCT International Search Report for PCT/US99/02903 Dated Aug. 31, 1999.

C.D. Dobson, A. Kiermasz, K. Beekman, R.J. Wilby, "Advanced $SiO_2$ Planarization Using Silane and $H_2O_2$," Dec. 1994, pp. 85-87.

L.C. Feldman, Murray Hill, and W.F. Van Der Weg, "Applied Surface Science," vol. 43 (1989), pp. 4-6.

"Journal of Vacuum Science & Technology A Vacuum, Surfaces, and Films," J. Vac. Sci. Technol. A, vol. 13, No. 2, Mar./Apr. 1995, pp. 475-480.

M. Matsuura, et al. "Novel Self-planarizing CVD Oxide for Interlayer Dielectric Applications," 1994, pp. 5.7.1.-5.7.4.

Frederic Gaillard, et al. "Silicon dioxide chemical vapor deposition using silane and hydrogen peroxide," J. Vac. Sci. Technol. Jul./Aug. 1996, pp. 2767-2769.

A. Nara and H. Itoh, "Low Dielectric Constant Insulator Formed by Downstream Plasma CVD at Room Temperature Using $TMS/O_2$", Japanese Journal of Applied Physics, vol. 36. No. 3B (Mar. 1997).

Luther et al., "Planar Copper-Polyimide Back End of the Line Interconnections for ULSI Devices", Jun. 8-9, 1993, VMIC Conference, 1993 ISMIC-102/93/0015, pp. 15-21.

C. Rau et al, "Mechanisms Of Plasma Polymerization Of Various Silico-Organic Monomers", Thin Solid Films, pp. 28-37, 249 (1994).

S. Sahli et al., "Properties of Plasma-Polysiloxane Deposited by PECVD", Materials Chemistry and Physics, pp. 106-109, 33 (1993).

A.M. Wrobel et al., "Oligomeric Products in Plasma-Polymerized Organosilicones", J. Macromol. Sci-Chem., A20 (5&6), pp. 583-618 (1983).

Y. Osada et al., "Plasma-Exposed Polymerization of Cyclic Organosiloxanes in the Condensed Phase", Journal of Polymer Science: Polymer Letters Edition, vol. 19, pp. 369-374 (1981).

P. Favia et al., "The Role of Substrate Temperature and Bias in the Plasma Deposition from Tetramethylsilane", Plasma Sources Sci. Technol. 1 (1992) pp. 59-66.

D.S. Kim et al., "Deposition of Thermally Stable, Low Dielectric Constant Fluorocarbon/$SiO_2$ Composite Thin Film", American Institute of Physics, Appl. Phys. Lett., vol. 69, No. 18, Oct. 28, 1996, pp. 2776-2778.

V. Hazari et al., Characterization of Alternative Chemistries for Depositing PECVD Silicon Dioxide Films, DUMIC Conference,—333D/98/0319, pp. 319-326, Feb. 1998.

R. McCabe et al., "Large Area Diamond-Like Carbon Coatings by Ion Implantation", Surface Engineering vol. III: Process Technology and Surface Analysis, pp. 163-172, 1995.

P. Favia, "Plasma Deposition of Thin Films from a Fluorine-Containing Cyclosiloxane", Journal of Polymer Science: Part A: Polymer Chemistry, 1992, 10 pages.

M. R. Wertheimer et al., "Advances in Basic and Applied Aspects of Microwave Plasma Polymerization", Thin Solid Films, 115 (1984) pp. 109-124.

J.A. Theil et al., "Carbon Content of Silicon Oxide Films Deposited by Room Temperature Plasma Enhanced Chemical Vapor Deposition of Hexamethyldislsoxane snd Oxygen", Journal of Vacuum Science Technology, A 2(4), Jul./Aug. 1994, pp. 1365-1370.

N. Inagaki et al., "Plasma Polymerization of Organosilicon Compounds", Journal of Applied Polymer Science, vol. 30, pp. 3385-3395 (1985).

Y. Segui et al., "In Situ Electrical Property Measurements of Metal (Plasma Polysiloxane)/Metal Structures", Thin Solid Films, 155 (1987) pp. 175-185, Electronics and Optics.

Y. Segui et al., "Gas Discharge in Hexamethyldisiloxane", Journal of Applied Polymer Science, vol. 20 pp. 1611-1618 (1976).

N. Inagaki et al., "Preparation of Siloxane-Like Films by Glow Discharge Polymerization", Journal of Applied Polymer Science, vol. 29, pp. 3595-3605 (1984).

V.S. Nguyen et al.,"Plasma Organosilicon Polymers", J. Electrochem. Soc. Solid-State Science and Technology, vol. 132, No. 8, pp. 1925-1932, Aug. 1985.

K. J. Taylor et al., "Parylene Copolymers", Spring MRS, Symposium N, pp. 1-9, 1997.

S. McClatchie, et al. "Low Dielectric Constant Flowfill Technology for IMD Applications" DUMIC Conference 1997 ISMIC-222D/97/0034 (Feb. 10-11, 1997).

A. Grill, et al., "Diamondlike Carbon Materials as Beol Interconnect Dielectrics: Integration Issues", The Electrochemical Society Proceedings, vol. 98-3.

A. Haas Bar-Ilan, et al., "A Comparative Study of Sub-Micron Gap Filling and Planarization Techniques", SPIE, vol. 263, pp. 277-288.

M.J. Loboda, et al., "Safe Precursor Gas for Broad Replacement of $SiH_4$ In Plasma Processes Employed In Integrated Circuit Production", Materials Research Society, vol. 447 (1997).

M.J. Loboda, et al., "Plasma-enhanced Chemical Vapor Deposition of a-SiC:H Films From Organosilicon Precursors", J. Vac. Sci. Techno. A 12(1), J/Feb. (1994).

Minoru Moriyama, et al., "Thermal Stability of $SiN_xC_y$ Films Prepared by Plasma CVD", Journal of the Ceramic Society of Japan 101 (7) 757-783 (1993).

M. Ducarroir, et al., "SiCN Coatings Prepared by PACVD from $TMS-NH_3$-Ar System On Steel", Journal de Physique IV, vol. 3.

Bunshah et al., "Deposition Technologies for Films and Coatings, Developments and Applications; Noyes Publications"; 1982; pp. 339-367.

Y. Horiike, et al., "Filling of Si Oxide Into a Deep Trench Using Digital CVDF Method", Elsevier Science Publishers B.V. (North-Holland).

S. Noguchi, et al., "Liquid Phase Oxidation Employing O Atoms Produced by Microwave Discharge and Si(CH$_3$)$_4$", Extended Abstracts of the 19th Conference on Solid State Devices and Materials, Tokyo, 1987, pp. 451-454.

Pierson, Handbook of Chemical Vapor Deposition (CVD); Principles, Technology, and Applications, 1992, pp. 208-209.

Hiroaki Tada, Koichiro Nakamura, and Hirotsugu Nagayama, "Correlations Between Wetting and Structure in Methylsiloxane Layers on Oxides Formed by Chemical Vapor Surface Modification", The Journal of Physical Chemistry, vol. 98, No. 47 (Nov. 24, 1994).

European Search Report for EP 00 11 2300 dated Aug. 4, 2001.

M.J. Loboda, "Using Trimethylsilane to Improve Safety, Throughput and Versatility in PECVD Processes"; Electrochemical Proceedings vol. 97-10, pp. 443-453.

Ichiro Tajima and Minoru Yamamoto, Characterization of Plasma Polymers from Tetramethylsilane, Octamethylcyclotetrasiloxane, and Methyltrimethoxysilane, J. Polym. Sci. Part A Polym. Chem. Ed., vol. 25, 1737-1744 (1987).

Extended European Search Report dated Jun. 6, 2007 for European Application No. 05014450.0.

Bakli et al., "Materials and Processing for 0.25 mum Multilevel Interconnect" Microelectronic Engineering, Elsevier Publishers BV., Amsterdam, NL, vol. 33, No. 1, Jan. 1997, pp. 175-188.

Bhan, et al., "Deposition of Stable Low K and High Deposition Rate SiF$_4$-Doped TEOS Fluorinated Silicon Dioxide (SiOF) Films," Thin Solid Films 308-309 (1997) pp. 507-511.

C.F. Lin, et al., "Improved Ozone-Tetraethoxysilane Oxide Reliability for Deep Submicron Inter-Metal Dielectric Applications by Deposition of a Silane-Based Oxide Underlayer," Thin Solid Films 308-309 (1997) pp. 621-626.

European Search Report from European Patent Office for 99906897.6, dated Jan. 10, 2005.

European Search Report for EP 01 30 3567, dated Nov. 4, 2004.

Notice of Reasons for Rejection dated Nov. 25, 2008 for Japanese Patent Application No. 2000-531599.

European Examination Report for EP 00 112 820.6, dated Apr. 23, 2008.

A. Klump, "Photo Induced Tranformation of Polysiloxane Layers to SiO$_2$," Applied Surface Science, vol. 43 (1989), pp. 301-303.

K.H.A. Bogart, et al., "Plasma Enhanced Chemical Vapor Deposition of SiO$_2$ Using Novel Alkoxysilane Precursors," J. Vac. Sci. Technol. A, vol. 13, No. 2, Mar./Apr. 1995, pp. 476-480.

Shu, et al.; U.S. Appl. No. 09/019,900, filed Feb. 6, 1998, entitled: "Producing a Thin Film Having a Low Dielectric Constant Dielectric Constant HDP-CVD".

The Board's Decision on Appeal mailed Sep. 16, 2004, for U.S. Appl. No. 09/477,126, filed Dec. 30, 1999.

The Board's Decision on Request for Rehearing mailed Dec. 23, 2004, for U.S. Appl. No. 09/477,126, filed Dec. 30, 1999.

Wolf, et al.; Silicon Processing for the VLSI Era, vol. 1: Process Technology, 1986 by Lattice Press, pp. 161-174.

Japanese Notice of Reasons for Rejection for Patent Application No. P2000-531599 dated Jul. 21, 2009.

Japanese Notice of Reasons for Rejection for Patent Application No. P2001-310275 dated Jul. 14, 2009.

* cited by examiner

LOW DIELECTRIC CONSTANT FILM PRODUCED FROM SILICON COMPOUNDS COMPRISING SILICON-CARBON BOND

CROSS-REFERENCE TO RELATED APPLICATIONS

The present application is a continuation of pending U.S. patent application Ser. No. 10/756,122, filed Jan. 13, 2004, which is a continuation of U.S. patent application Ser. No. 09/477,126, filed Dec. 30, 1999, now abandoned which is a continuation of U.S. patent application Ser. No. 09/021,788, filed Feb. 11, 1998, and now issued as U.S. Pat. No. 6,054,379. Furthermore, this application is related to all applications and patents claiming priority to Ser. No. 09/021,788.

BACKGROUND OF THE DISCLOSURE

1. Field of the Invention

The present invention relates to the fabrication of integrated circuits. More particularly, the invention relates to a process and apparatus for depositing dielectric layers on a semiconductor substrate.

2. Background of the Invention

One of the primary steps in the fabrication of modern semiconductor devices is the formation of metal and dielectric films on a semiconductor substrate by chemical reaction of gases. Such deposition processes are referred to as chemical vapor deposition or CVD. Conventional thermal CVD processes supply reactive gases to the substrate surface where heat-induced chemical reactions take place to produce a desired film. The high temperatures at which some thermal CVD processes operate can damage device structures having layers previously formed thereon. A preferred method of depositing metal and dielectric films at relatively low temperatures is plasma-enhanced CVD (PECVD) techniques such as described in U.S. Pat. No. 5,362,526. Plasma-enhanced CVD techniques promote excitation and/or disassociation of the reactant gases by the application of radio frequency (RF) energy to a reaction zone near the substrate surface, thereby creating a plasma of highly reactive species. The high reactivity of the released species reduces the energy required for a chemical reaction to take place, and thus lowers the required temperature for such PECVD processes.

Semiconductor device geometries have dramatically decreased in size since such devices were first introduced several decades ago. Since then, integrated circuits have generally followed the two-year, half-size rule (often called Moore's Law), which means that the number of devices that will fit on a chip doubles every two years. Today's wafer fabrication plants are routinely producing devices having 0.35 μm and even 0.18 μm feature sizes, and tomorrow's plants soon will be producing devices having even smaller geometries.

In order to further reduce the size of semiconductor devices on integrated circuits, it has become necessary to use conductive materials having low resistivity and insulators having low k (dielectric constant<4.0) to reduce the capacitive coupling between adjacent metal lines. For example, copper is now being considered as an interconnect material in place of aluminum because copper has a lower resistivity and higher current carrying capacity. However, these materials present new problems for integrated circuit manufacturing processes. For example, many low k dielectric materials are porous and are preferably protected by liner layers to prevent diffusion of metals. Conventional liner layers, such as SiN, have higher dielectric constants, and the combination of low k dielectric layers with high k dielectric liner layers may result in little or no improvement in the overall stack dielectric constant and capacitive coupling.

As shown in FIG. 1A, International Publication Number WO 94/01885 describes a PECVD process for depositing a multi-component dielectric layer wherein a silicon dioxide ($SiO_2$) liner layer 2 is first deposited on a patterned metal layer having metal lines 3 formed on a substrate 4. The liner layer 2 is deposited by reaction of silane ($SiH_4$) and nitrous oxide ($N_2O$). A self-planarizing low k dielectric layer 5 is then deposited on the liner layer 2 by reaction of a silane compound and a peroxide compound. The liner layer 2 is an oxidized silane film that has excellent barrier properties when deposited in a manner which provides a dielectric constant of about 4.5. The dielectric constant of the oxidized silane film can be decreased to about 4.1 by altering process conditions in a manner that decreases barrier properties of the film.

As shown in FIG. 1B, WO 94/01885 further describes an optional $SiO_2$ cap layer 6 that is deposited on the low k dielectric layer 5 by the reaction of silane and $N_2O$. The cap layer 6 is also an oxidized silane film that has excellent barrier properties when deposited in a manner which provides a dielectric constant of about 4.5. Both the liner layer 2 and the cap layer 6 have a dielectric constant greater than 4.0 and the high dielectric constant layers substantially detract from the benefit of the low k dielectric layer.

The benefit of some low k dielectric materials is further compromised by low oxide content which makes the material inadequate as an etch stop layer. Silicon nitride has been the etch stop material of choice for use with low k dielectric materials. However, the silicon nitride disposed between low k dielectric layers is within the fringing field between the interconnects. Silicon nitride has a relatively high dielectric constant (dielectric constant of about 7) compared to the surrounding dielectric, and it has been discovered that the silicon nitride may significantly increase the capacitive coupling between interconnect lines, even when an otherwise low k dielectric material is used as the primary insulator. This may lead to cross talk and/or resistance-capacitance (RC) delay which degrades the overall performance of the device.

As devices get smaller, liner layers, cap layers, and etch stop layers contribute more to the overall dielectric constant of pa multi-component dielectric layer. There remains a need for low k dielectric layers which have excellent barrier properties for use as liner or cap layers. There also remains a need for low k dielectric layers which have sufficient oxide content for use as etch stop layers. Ideally, the low k dielectric layers would be compatible with existing low k dielectric materials and could be deposited in the same chambers as existing low k dielectric materials.

SUMMARY OF THE INVENTION

The present invention provides a method and apparatus for deposition of a low dielectric constant layer which is produced by oxidation of an organo silane compound during plasma enhanced chemical vapor deposition. The oxidized organo silane layers have excellent barrier properties for use as a liner or cap layer adjacent other dielectric layers such as porous low k dielectric layers. In addition, the oxidized organo silane layers have can be used as an etch stop layer, as an adhesive layer between different layers, or as an intermetal dielectric layer. A preferred oxidized organ silane layer is produced by reaction of methyl silane, $CH_3SiH_3$, and nitrous oxide, $N_2O$.

In a preferred embodiment, a low k dielectric layer is deposited on a patterned metal layer by reaction of an organo silane compound and an oxidizing compound. A self-planarizing dielectric layer is then deposited in the same chamber by reaction of an organo-silane compound and a peroxide bonding compound. The self-planarizing dielectric layer is optionally capped in the same chamber by further reaction of the organo silane compound and the oxidizing compound. The liner and cap layers provide strength to the self-planarizing dielectric layer during annealing of the self-planarizing dielectric layer. After annealing, the liner and cap layers serve as diffusion barriers which protect the self-planarizing dielectric layer.

The present invention further provides an etch stop material which provides a reliable dual damascene structure while minimizing the contribution of the etch stop layer to the capacitive coupling between interconnect lines. In a preferred embodiment, a low k dielectric film, such as an amorphous carbon (α-C) or amorphous fluorinated carbon (α-FC) film is used as the etch stop below an intermetal dielectric (IMD). Other low k materials, such as parylene, $AF_4$, BCB, or PAE, or high k materials, such as oxynitride and silicon carbide, may also be used with the etch stop material.

A preferred etch stop process sequence comprises forming a dual damascene structure by depositing a first dielectric layer, such as parylene or a fluorinated silicate glass (FSG) layer, on a substrate, depositing the low k dielectric etch stop of the present invention on the first dielectric layer, patterning the etch stop to define the contacts/vias, depositing a second layer of a dielectric, patterning a resist layer on the second layer of dielectric to define one or more interconnects, and etching the interconnects and contacts/vias. The interconnects are etched down to the etch stop, and then the etching continues past the patterned etch stop to define the contacts/vias. Once the dual damascene structure has been formed, a barrier layer is preferably deposited conformably in the structure prior to filling the structure with copper to isolate the copper from other materials, such as silicon. The upper surface is then planarized using chemical mechanical polishing techniques.

The invention further provides an intermetal dielectric material comprising the low k dielectric film which is deposited on a conventional etch stop such as silicon oxide or silicon nitride. The low k dielectric film can also be deposited as a thin adhesive layer.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

Figure 1A:
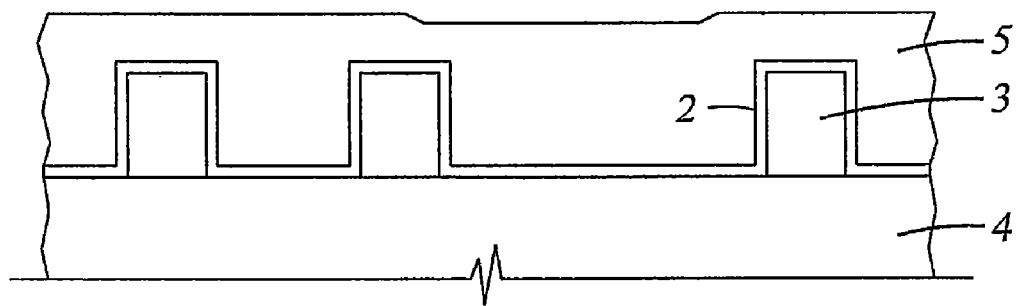
FIG. 1A-1B (Prior Art) are schematic diagrams of dielectric layers deposited on a substrate by the processes known in the art.
Figure 1B:
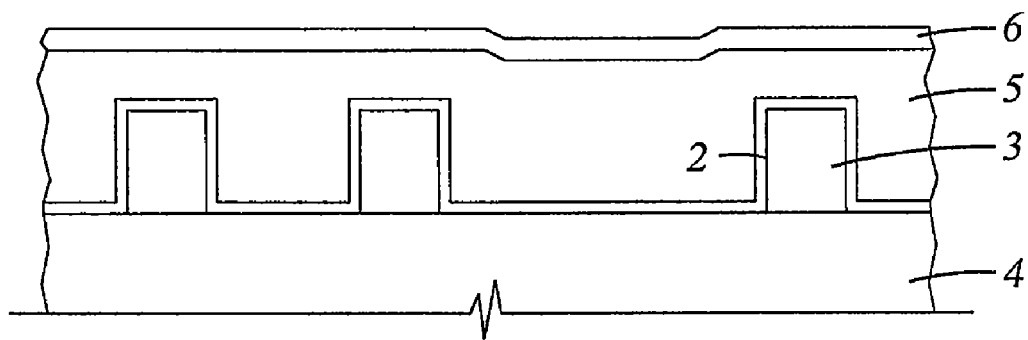

For a further understanding of the present invention, reference should be made to the ensuing detailed description.

DESCRIPTION OF A PREFERRED EMBODIMENT

The present invention provides a method and apparatus for depositing a low dielectric constant layer which has excellent barrier properties and high oxide content. The low dielectric layer is an oxidized organo silane layer that can be used as a lining layer adjacent other dielectric materials, as an etch stop layer adjacent dielectric materials having lower oxide content, as an intermetal dielectric layer, and as an adhesion layer between different materials. The oxidized organo silane material is deposited by oxidation of an organo silane compound which does not fully oxidize. Carbon, including some organo functional groups, which remains in the oxidized organo silane layer contribute to low dielectric constants and excellent barrier properties.

The organo silane compounds generally include the structure:

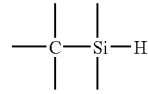

wherein —C— is included in an organo group and some C—Si bonds are not broken during oxidation. Preferably —C— is included in an alkyl, such as methyl or ethyl, or an aryl, such as phenyl. Suitable organo groups also can include alkenyl and cyclohexenyl groups and functional derivatives. The preferred organo silane compounds have the structure $SiH_a(CH_3)_b(C_2H_5)_c(C_6H_5)_d$, where a=1 to 3, b=0 to 3, c=0 to 3, d=0 to 3, and a+b+c+d=4, or the structure $Si_2H_e(CH_3)_f(C_2H_5)_g(C_6H_5)_h$, where e=1 to 5, f=0 to 5, g=0 to 5, h=0 to 5, and e+f+g+h=6. Preferred organo silane compounds include methyl silane compounds having the structure $SiH_n(CH_3)_{4-n}$, where n=1 to 3, or the structure $Si_2H_m(CH_3)_{6-m}$, where m=1 to 5. The most preferred organo silane compound is methyl silane, $CH_3SiH_3$. The organo silane compounds are oxidized during deposition by reaction with oxygen ($O_2$) or oxygen containing compounds such as nitrous oxide ($N_2O$), preferably $N_2O$, such that the carbon content of the deposited film is from 1 to 50% by atomic weight, preferably about 20%. The oxidized organo silane layer has a dielectric constant of about 3.0 and has excellent barrier properties. The oxidized organo silane layers further have high oxide contents in comparison to conventional low k dielectric layers and good adhesion properties.

The present invention further provides a substrate processing system having a plasma reactor including a reaction zone, a substrate holder for positioning a substrate in the reaction zone, and a vacuum system. The processing system further comprises a gas/liquid distribution system connecting the reaction zone of the vacuum chamber to supplies of an organo silane compound, an oxidizing gas, and an inert gas, and an RF generator coupled to the gas distribution system for generating a plasma in the reaction zone. The processing system further comprises a controller comprising a computer for controlling the plasma reactor, the gas distribution system, and the RF generator, and a memory coupled to the controller, the memory comprising a computer usable medium comprising a computer readable program code for selecting the process steps of depositing a low dielectric constant film with a plasma of an organo silane compound and an oxidizing gas.

The processing system may further comprise in one embodiment computer readable program code for selecting the process steps of depositing a liner of the oxidized organo silane compound, depositing a different dielectric layer, and optionally depositing a capping layer of the oxidized organo silane compound.

Further description of the invention will be directed toward specific embodiments.

Exemplary CVD Plasma Reactor

Figure 2:
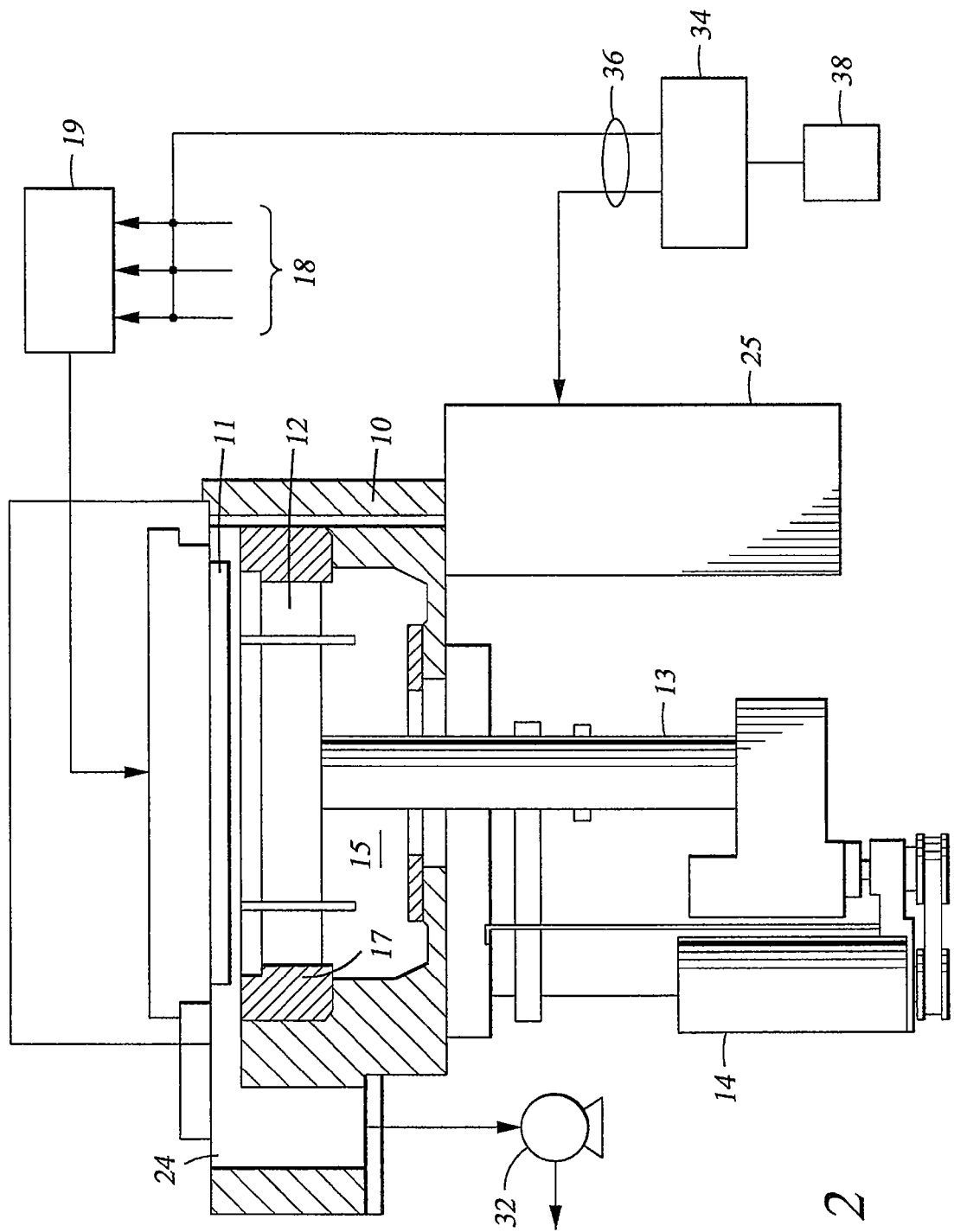
FIG. 2 is a cross-sectional diagram of an exemplary CVD plasma reactor configured for use according to the present invention.

One suitable CVD plasma reactor in which a method of the present invention can be carried out is shown in FIG. 2, which is a vertical, cross-section view of a parallel plate chemical vapor deposition reactor 10 having a high vacuum region 15. Reactor 10 contains a gas distribution manifold 11 for dispersing process gases through perforated holes in the manifold to a substrate or wafer (not shown) that rests on a substrate support plate or susceptor 12 which is raised or lowered by a lift motor 14. A liquid injection system (not shown), such as typically used for liquid injection of TEOS, may also be provided for injecting a liquid organo silane compound. The preferred methyl silanes and ethyl silanes are gases.

The reactor 10 includes heating of the process gases and substrate, such as by resistive heating coils (not shown) or external lamps (not shown). Referring to FIG. 2, susceptor 12 is mounted on a support stem 13 so that susceptor 12 (and the wafer supported on the upper surface of susceptor 12) can be controllably moved between a lower loading/off-loading position and an upper processing position which is closely adjacent to manifold 11.

When susceptor 12 and the wafer are in processing position 14, they are surrounded by an insulator 17 and process gases exhaust into a manifold 24. During processing, gases inlet to manifold 11 are uniformly distributed radially across the surface of the wafer. A vacuum pump 32 having a throttle valve controls the exhaust rate of gases from the chamber.

Before reaching manifold 11, deposition and carrier gases are input through gas lines 18 into a mixing system 19 where they are combined and then sent to manifold 11. Generally, the process gases supply lines 18 for each of the process gases include (i) safety shut-off valves (not shown) that can be used to automatically or manually shut off the flow of process gas into the chamber, and (ii) mass flow controllers (also not shown) that measure the flow of gas through the gas supply lines. When toxic gases are used in the process, several safety shut-off valves are positioned on each gas supply line in conventional configurations.

The deposition process performed in reactor 10 can be either a thermal process or a plasma enhanced process. In a plasma process, a controlled plasma is typically formed adjacent to the wafer by RF energy applied to distribution manifold 11 from RF power supply 25 (with susceptor 12 grounded). Alternatively, RF power can be provided to the susceptor 12 or the RF power can be split between different components. RF power supply 25 can supply either single or mixed frequency RF power to enhance the decomposition of reactive species introduced into the high vacuum region 15. A mixed frequency RF power supply typically supplies power at a high RF frequency (RF1) of 13.56 MHz and at a low RF frequency (RF2) of 360 KHz.

Typically, any or all of the chamber lining, gas inlet manifold faceplate, support stem 13, and various other reactor hardware is made out of material such as aluminum or anodized aluminum. An example of such a CVD reactor is described in U.S. Pat. No. 5,000,113, entitled "Thermal CVD/PECVD Reactor and Use for Thermal Chemical Vapor Deposition of Silicon Dioxide and In-situ Multi-step Planarized Process," issued to Wang et al. And assigned to Applied Materials, Inc., the assignee of the present invention.

The lift motor 14 raises and lowers susceptor 12 between a processing position and a lower, wafer-loading position. The motor, the gas mixing system 19, and the RF power supply 25 are controlled by a system controller 34 over control lines 36. The reactor includes analog assemblies, such as mass flow controllers (MFCs) and RF generators, that are controlled by the system controller 34 which executes system control software stored in a memory 38, which in the preferred embodiment is a hard disk drive. Motors and optical sensors are used to move and determine the position of movable mechanical assemblies such as the throttle valve of the vacuum pump 32 and motor for positioning the susceptor 12.

The system controller 34 controls all of the activities of the CVD reactor and a preferred embodiment of the controller 34 includes a hard disk drive, a floppy disk drive, and a card rack. The card rack contains a single board computer (SBC), analog and digital input/output boards, interface boards and stepper motor controller boards. The system controller conforms to the Versa Modular Europeans (VME) standard which defines board, card cage, and connector dimensions and types. The VME standard also defines the bus structure having a 16-bit data but and 24-bit address bus.

Figure 3:
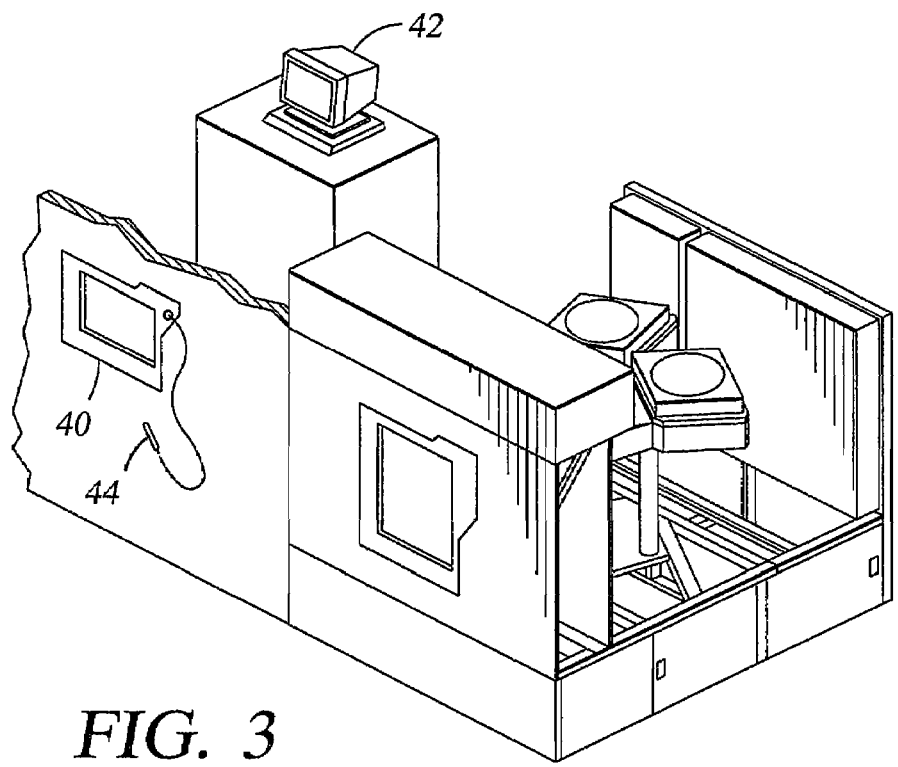
FIG. 3 is a diagram of the system monitor of the CVD plasma reactor of FIG. 2.

The system controller 34 operates under the control of a computer program stored on the hard disk drive 38. The computer program dictates the timing, mixture of gases, RF power levels, susceptor position, and other parameters of a particular process. The interface between a user and the system controller is via a CRT monitor 40 and light pen 44 which are depicted in FIG. 3. In the preferred embodiment a second monitor 42 is used, the first monitor 40 being mounted in the clean room wall for the operators and the other monitor 42 behind the wall for the service technicians. Both monitors 40, 42 simultaneously display the same information but only one light pen 44 is enabled. The light pen 44 detects light emitted by CRT display with a light sensor in the tip of the pen. To select a particular screen or function, the operator touches a designated area of the display screen and pushes the button on the pen 44. The touched area changes its highlighted color, or a new menu or screen is displayed, confirming communication between the light pen and the display screen.

Figure 4:
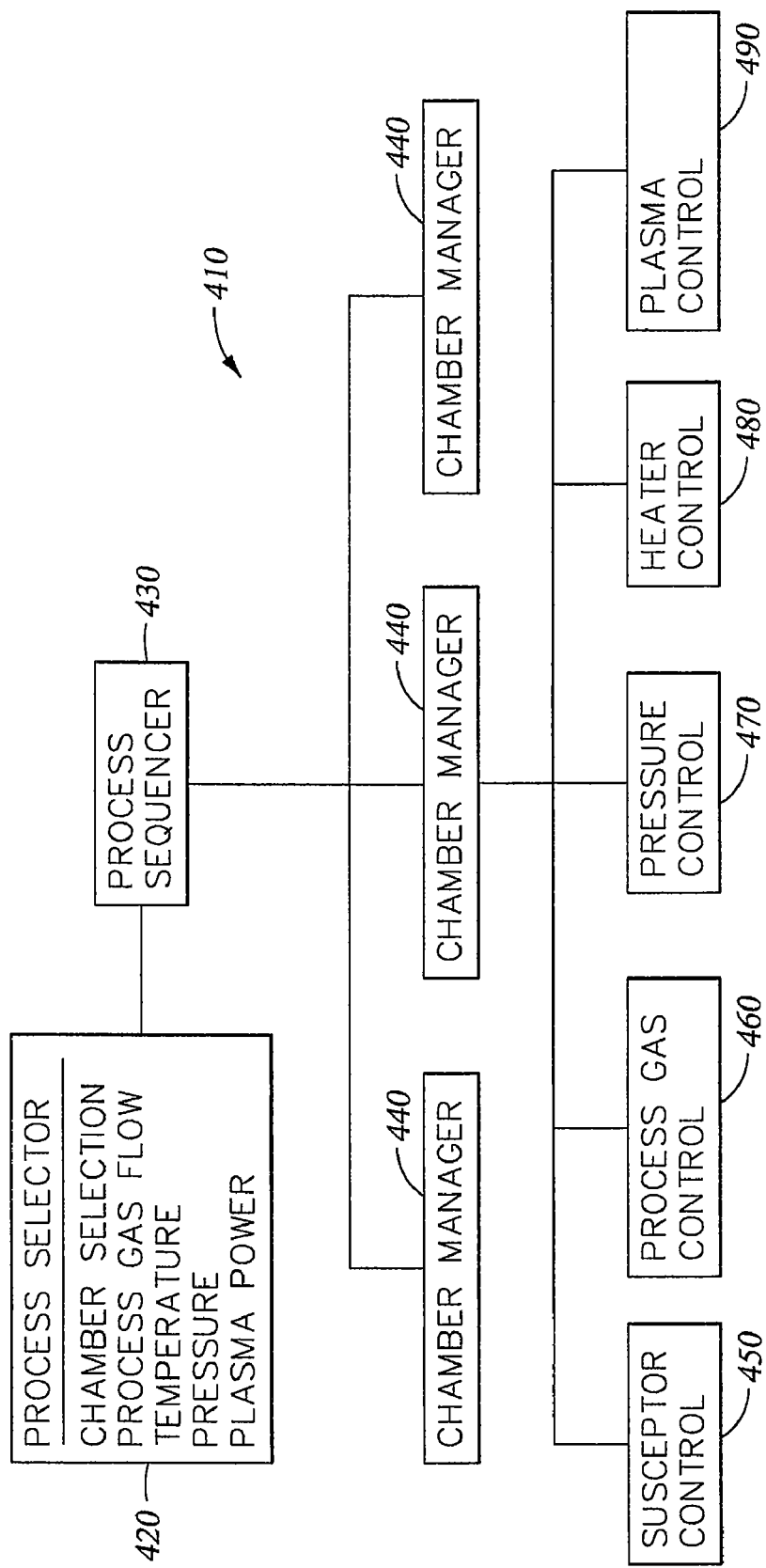
FIG. 4 is a flowchart of a process control computer program product used in conjunction with the exemplary CVD plasma reactor of FIG. 2.

Referring to FIG. 4, the process can be implemented using a computer program product 410 that runs on, for example, the system controller 34. The computer program code can be written in any conventional computer readable programming language such as for example 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

FIG. 4 shows an illustrative block diagram of the hierarchical control structure of the computer program 410. A user enters a process set number and process chamber number into a process selector subroutine 420 in response to menus or screens displayed on the CRT monitor 40 by using the light pen 44 interface. The process sets are predetermined sets of process parameters necessary to carry out specified processes, and are identified by predefined set numbers. The process selector subroutine 420 the (i) selects a desired process chamber on a cluster tool such as an Centura™ platform (available from Applied Materials, Inc.), and (ii) selects a desired set of process parameters needed to operate the process chamber for performing the desired process. The process parameters for performing a specific process relate to process conditions such as, for example, process gas composition and flow rates, temperature, pressure, plasma conditions such as RF bias power levels and magnetic field power levels, cooling gas pressure, and chamber wall temperature and are provided to the user in the form of a recipe. The parameters specified by the recipe are entered utilizing the light pen/CRT monitor interface.

The signals for monitoring the process are provided by the analog input and digital input boards of system controller and the signals for controlling the process are output on the analog output and digital output boards of the system controller 34.

A process sequencer subroutine 430 comprises program code for accepting the identified process chamber and set of process parameters from the process selector subroutine 420, and for controlling operation of the various process chambers. Multiple users can enter process set numbers and process chamber numbers, or a user can enter multiple process chamber numbers, so the sequencer subroutine 430 operates to schedule the selected processes in the desired sequence. Preferably the sequencer subroutine 430 includes computer readable program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer subroutine 430 can be designed to take into consideration the present condition of the process chamber being used in comparison with the desired process conditions for a selected process, or the age of each particular user entered request, or any other relevant factor a system programmer desires to include for determining the scheduling priorities.

Once the sequencer subroutine 430 determines which process chamber and process set combination is going to be executed next, the sequencer subroutine 430 causes execution of the process set by passing the particular process set parameters to a chamber manager subroutine 440 which controls multiple processing tasks in a process chamber 10 according to the process set determined by the sequencer subroutine 430. For example, the chamber manager subroutine 440 comprises program code for controlling CVD process operations in the process chamber 10. The chamber manager subroutine 440 also controls execution of various chamber component subroutines which control operation of the chamber component necessary to carry out the selected process set. Examples of chamber component subroutines are susceptor control subroutine 450, process gas control subroutine 460, pressure control subroutine 470, heater control subroutine 480, and plasma control subroutine 490. Those having ordinary skill in the art would readily recognize that other chamber control subroutines can be included depending on what processes are desired to be performed in the reactor 10.

In operation, the chamber manager subroutine 440 selectively schedules or calls the process component subroutines in accordance with the particular process set being executed. The chamber manager subroutine 440 schedules the process component subroutines similarly to how the sequencer subroutine 430 schedules which process chamber 10 and process set is to be executed next. Typically, the chamber manager subroutine 440 includes steps of monitoring the various chamber components, determining which components needs to be operated based on the process parameters for the process set to be executed, and causing execution of a chamber component subroutine responsive to the monitoring and determining steps.

Operation of particular chamber components subroutines will now be described with reference to FIG. 4. The susceptor control positioning subroutine 450 comprises program code for controlling chamber components that are used to load the substrate onto the susceptor 12, and optionally to lift the substrate to a desired height in the reactor 10 to control the spacing between the substrate and the gas distribution manifold 11. When a substrate is loaded into the reactor 10, the susceptor 12 is lowered to receive the substrate, and thereafter, the susceptor 12 is raised to the desired height in the chamber, to maintain the substrate at a first distance or spacing from the gas distribution manifold 11 during the CVD process. In operation, the susceptor control subroutine 450 controls movement of the susceptor 12 in response to process set parameters that are transferred from the chamber manager subroutine 440.

The process gas control subroutine 460 has program code for controlling process gas composition and flow rates. The process gas control subroutine 460 controls the open/close position of the safety shut-off valves, and also ramps up/down the mass flow controllers to obtain the desired gas flow rate. The process gas control subroutine 460 is invoked by the chamber manager subroutine 440, as are all chamber components subroutines, and receives from the chamber manager subroutine process parameters related to the desired gas flow rates. Typically, the process gas control subroutine 460 operates by opening the gas supply lines, and repeatedly (i) reading the necessary mass flow controllers, (ii) comparing the readings to the desired flow rates received from the chamber manager subroutine 440, and (iii) adjusting the flow rates of the gas supply lines as necessary. Furthermore, the process gas control subroutine 460 includes steps for monitoring the gas flow rates for unsafe rates, and activating the safety shut-off valves when an unsafe condition is detected.

In some processes, an inert gas such as helium or argon is flowed into the reactor 10 to stabilize the pressure in the chamber before reactive process gases are introduced into the chamber. For these processes, the process gas control subroutine 460 is programmed to include steps for flowing the inert gas into the chamber 10 for an amount of time necessary to stabilize the pressure in the chamber, and then the steps described above would be carried out. Additionally, when a process gas it to be vaporized from a liquid precursor, for example phenyl silane, the process gas control subroutine 460 would be written to include steps for bubbling a delivery gas such as helium through the liquid precursor in a bubbler assembly. For this type of process, the process gas control subroutine 460 regulates the flow of the delivery gas, the pressure in the bubbler, and the bubbler temperature in order to obtain the desired process gas flow rates. As discussed above, the desired process gas flow rates are transferred to the process gas control subroutine 460 as process parameters. Furthermore, the process gas control subroutine 460 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 470 comprises program code for controlling the pressure in the reactor 10 by regulating the size of the opening of the throttle valve in the exhaust pump 32. The size of the opening of the throttle valve is set to control the chamber pressure to the desired level in relation to the total process gas flow, size of the process chamber, and pumping set point pressure for the exhaust pump 32. When the pressure control subroutine 470 is invoked, the desired, or target pressure level is received as a parameter from the chamber manager subroutine 440. The pressure control subroutine 470 operates to measure the pressure in the reactor 10 by reading one or more conventional pressure manometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, the pressure control subroutine 470 can be written to open or close the throttle valve to a particular opening size to regulate the reactor 10 to the desired pressure.

The heater control subroutine 480 comprises program code for controlling the temperature of the heat modules or radiated heat that is used to heat the susceptor 12. The heater control subroutine 480 is also invoked by the chamber manager subroutine 440 and receives a target, or set point, temperature parameter. The heater control subroutine 480 measures the temperature by measuring voltage output of a thermocouple located in a susceptor 12, compares the measured temperature to the set point temperature, and increases or decreases current applied to the heat module to obtain the set point temperature. The temperature is obtained from the measured voltage by looking up the corresponding temperature in a stored conversion table, or by calculating the temperature using a fourth order polynomial. The heater control subroutine 480 gradually controls a ramp up/down of current applied to the heat module. The gradual ramp up/down increases the life and reliability of the heat module. Additionally, a built-in-fail-safe mode can be included to detect process safety compliance, and can shut down operation of the heat module if the reactor 10 is not properly set up.

The plasma control subroutine 490 comprises program code for setting the RF bias voltage power level applied to the process electrodes in the reactor 10, and optionally, to set the level of the magnetic field generated in the reactor. Similar to the previously described chamber component subroutines, the plasma control subroutine 490 is invoked by the chamber manager subroutine 440.

The above CVD system description is mainly for illustrative purposes, and other plasma CVD equipment such as electrode cyclotron resonance (ECR) plasma CVD devices, induction-coupled RF high density plasma CVD devices, or the like may be employed. Additionally, variations of the above described system such as variations in susceptor design, heater design, location of RF power connections and others are possible. For example, the wafer could be supported and heated by a resistively heated susceptor. The pretreatment and method for forming a pretreated layer of the present invention is not limited to any specific apparatus or to any specific plasma excitation method.

Figure 5:
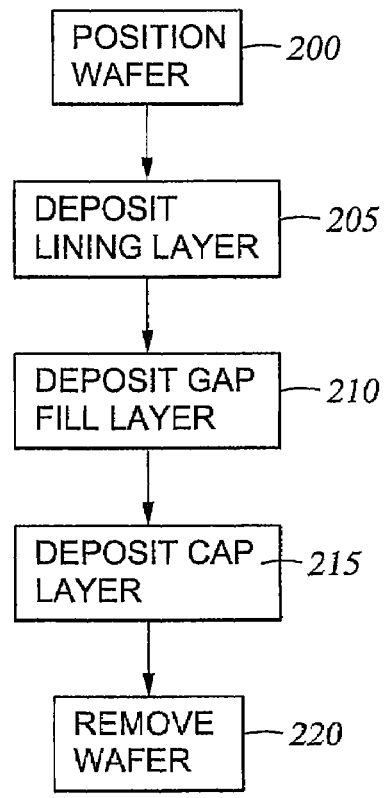
FIG. 5 is a flow chart illustrating steps undertaken in depositing liner and cap layers in a gap filling process according to one embodiment of the present invention.

Deposition of the Oxidized Organo Silane Dielectric in a Three-Layer Gap Filling Process The oxidized organo silane layer of the present invention can be used in a three-layer gap filling process as shown in FIG. 5 using the PECVD chamber of FIG. 2. Referring to FIG. 5, a wafer is positioned 200 in the reactor 10 and an oxidized organo silane layer having a low dielectric constant is deposited 205 by a PECVD process from a plasma comprising an organo silane compound, such as methyl silanes, ethyl silanes, or phenyl silanes, and an oxidizing gas. The deposition step 205 can include a capacitively coupled plasma or both an inductively and a capacitively coupled plasma in the process chamber 15 according to methods known in the art. An inert gas such as helium is commonly used in the PECVD deposition to assist in plasma generation. A gap fill layer is then deposited 210 on the liner layer by known methods. The gap fill layer is preferably self-planarizing, such as spin-on polymers or porous oxides deposited in liquid form by reaction of methyl silane and hydrogen peroxide. A cap layer is then deposited 215 on the gap fill layer, preferably using the same process for depositing the lining layer. The wafer is then removed 220 from the reactor 10.

Referring to FIGS. 6A-6E, the three-layer gap filling process provides a PECVD lining layer 300 of the oxidized organo silane polymer. The lining layer 300 acts as an isolation layer between a subsequent PECVD gap fill layer 302 and the underlying substrate surface 304 and metal lines 306, 308, 310 formed on the substrate surface. The gap fill layer 302 is capped by a PECVD capping layer 312 of the oxidized organo silane polymer. This process is implemented and controlled using a computer program stored in the memory 38 of a computer controller 34 for a CVD reactor 10.

Figure 6A:
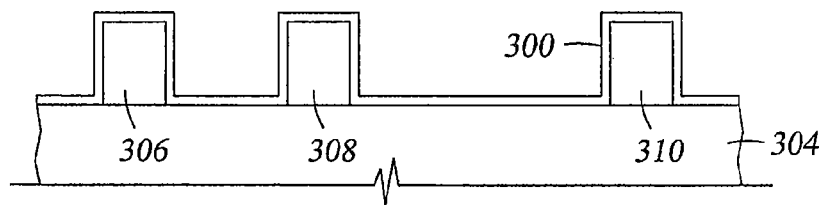
FIG. 6A-6E is a schematic diagram of the layers deposited on a substrate by the process of FIG. 5.

Referring to FIG. 6A, the PECVD lining layer 300 is deposited in the reactor 10 by introducing an organo silane compound such as $CH_3SiH_3$, an oxidizing gas such as $N_2O$, and a carrier gas such as helium. The substrate is maintained at a temperature of from about −10 to about 450° C., and preferably is maintained at a temperature of approximately 0° C. throughout the deposition of the PECVD lining layer. The PECVD lining layer 300 is deposited with a process gas that includes a mixture of the organo silane compound at a flow rate of about 5 sccm to about 500 sccm and the oxidizing gas at a flow rate of about 5 sccm to about 2000 sccm. The process gases are carried by an inert gas such He, Ar, Ne, or a relatively inert gas such as nitrogen, which are typically not incorporated into the film, at a flow rate of from about 0.2 to about 20 lpm. The process gases react at a pressure from about 0.2 to about 20 Torr to form a conformal polymer layer on the substrate surface 304 and metal lines 306, 308, 310, on the substrate surface. The reaction is plasma enhanced with a power density ranging from 0.05 $W/cm^2$ to 1000 $W/cm^2$, preferably about 0.3 $W/cm^2$.

For an 8" single wafer chamber, the high frequency RF source of approximately 13.56 MHz is preferably driven at about 30 to about 500 W and a low frequency RF source of about 350 KHz to MHz is preferably driven at about 0 to about 500 W. In a currently preferred embodiment, the high frequency RF source is driven at about 50-150 W, while the low frequency RF source is driven at about 0-100 W.

The above process conditions result in the deposition of a PECVD lining layer 300 (at about 2000 Å per minute) with improved barrier characteristics for the subsequent deposition of the PECVD gap filling layer 302.

Figure 6B:
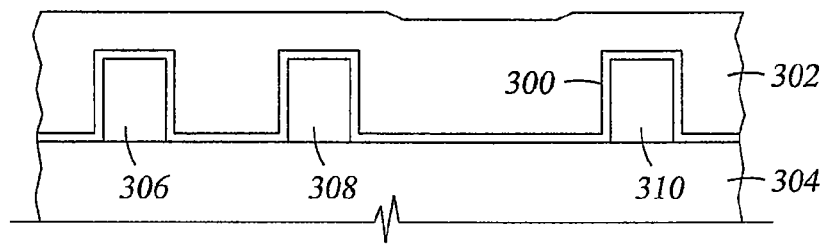
Figure 6C:
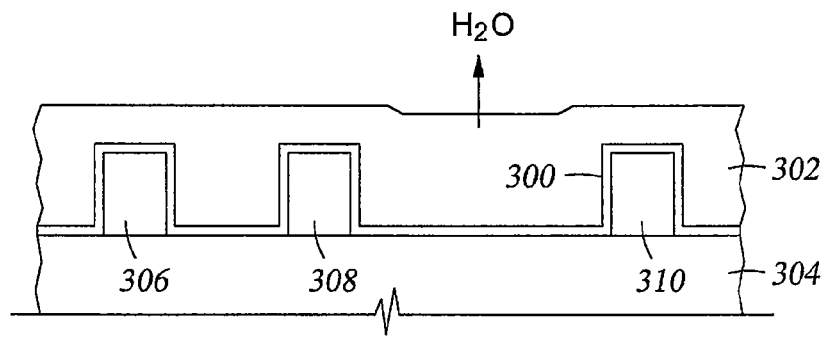
Figure 6D:
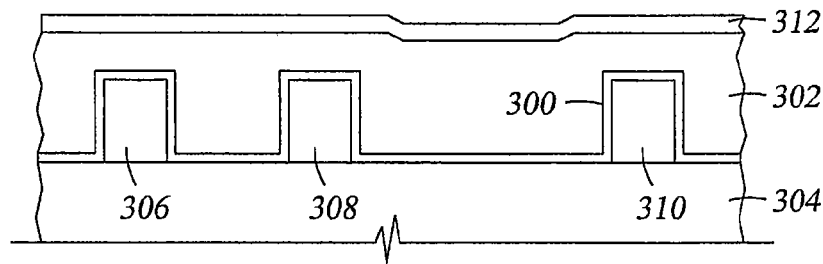

Referring to FIG. 6B, the PECVD gap filling layer 302 is deposited using similar reactor conditions as used for depositing the liner layer 300. The process gases for the gap filling layer 302 are preferably $SiH_4$, or $CH_3SiH_3$, and 50 wt % of hydrogen peroxide ($H_2O_2$) which is vaporized and mixed with an inert carrier gas, such as helium. However, the gap filling layer can be any dielectric layer which has an acceptable dielectric constant. The process gas flows range from 0-2000 sccm for He, 10-200 sccm for $CH_3SiH_3$, and 0.1 to 3 g/min. for $H_2O_2$. The preferred gas flows range from 100-500 sccm for He, 20-100 sccm for $CH_3SiH_3$, and 0.1 to 1 g/min. for $H_2O_2$. These flow rates are given for a chamber having a volume of approximately 5.5 to 6.5 liters. Preferably, reactor 10 is maintained at a pressure of about 0.2 to about 5 torr during deposition of the PECVD gap filling layer 302. The gap filling layer 302 may be partially cured as shown in FIG. 6C to remove solvents such as water prior to deposition of a cap layer 312 as shown in FIG. 6D. Curing is done in the reactor 10 by pumping under an inert gas atmosphere under 10 Torr.

Figure 6E:
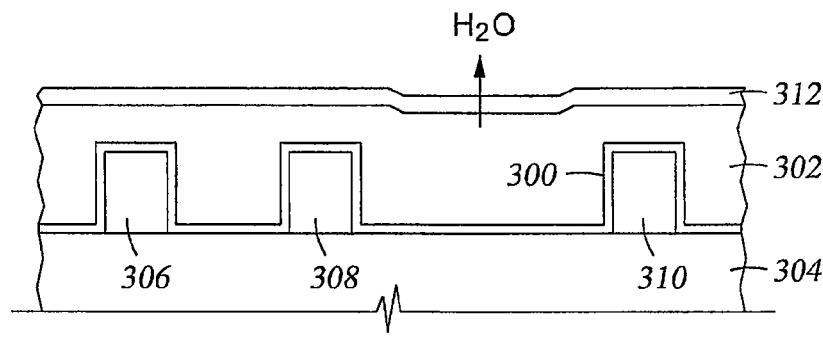

Referring to FIG. 6D, after deposition of the PECVD gap filling layer 302, the reactor 10 optionally resumes deposition of the oxidized organo silane layer of the present invention for deposition of a capping layer 312. Referring to FIG. 6E, after deposition of the capping layer, if any, the gap fill layer 302 is preferably annealed in a furnace or another chamber at a temperature from about 100 to about 450° C. to drive off remaining solvent such as water. Of course, processing conditions will vary according to the desired characteristics of the deposited films.

Deposition of a Dual Damascene Structure

Figure 7:
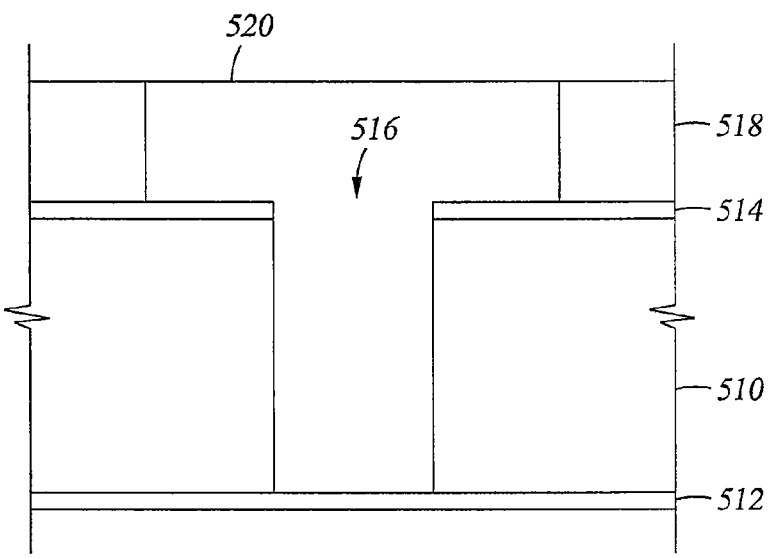
FIG. 7 is a cross sectional view showing a dual damascene structure comprising the low k dielectric layers of the present invention.

A dual damascene structure which includes an oxidized organo silane layers as an etch stop or as an intermetal dielectric layer is shown in FIG. 7. When the oxidized organo silane is used as an etch stop, a first dielectric layer 510 is deposited on a substrate 512 and then the oxidized organo silane etch stop 514 is deposited on the first dielectric layer. The etch stop is then pattern etched to define the openings of the contacts/vias 516. A second dielectric layer 518 is then deposited over the patterned etch stop and then pattern etched by conventional methods to define the interconnect lines 520. A single etch process is then performed to define the interconnects down to the etch stop and to etch the unprotected dielectric exposed by the patterned etch stop to define the contacts/vias.

Referring again to FIG. 7, the damascene structure alternatively includes the oxidized organo silane as an intermetal dielectric. A first dielectric layer 510, preferably consisting of the oxidized organo silane, is deposited on a substrate 512 and then a conventional silicon oxide or silicon nitride etch stop 514 is deposited on the first dielectric layer. The etch stop is then patterned to define the openings of the contacts/vias 516. A second dielectric layer 518, consisting of the oxidized organo silane, is then deposited over the patterned etch stop and then patterned to define the interconnect lines 520. A single etch process is then performed to define the interconnects down to the etch stop and to etch the unprotected dielectric exposed by the patterned etch stop to define the contacts/vias.

Figure 8A:
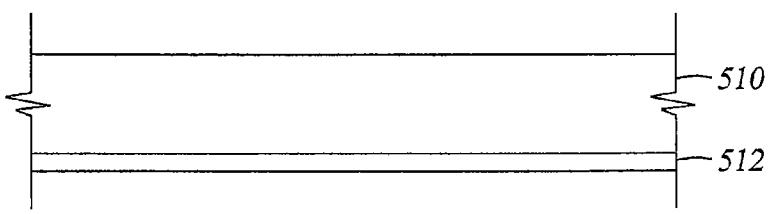
FIGS. 8A-8H are cross sectional views showing one embodiment of a dual damascene deposition sequence of the present invention.
Figure 8B:
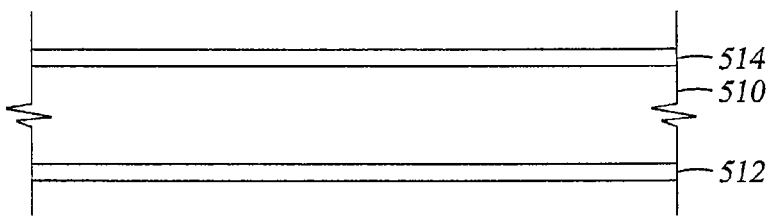
Figure 8C:
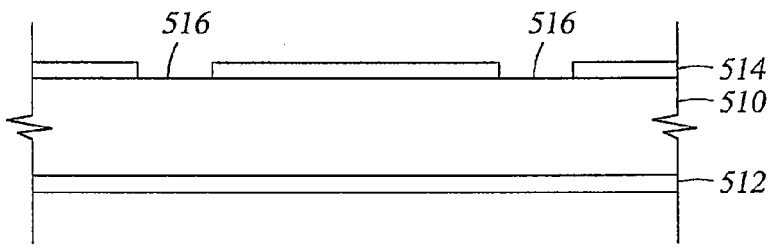
Figure 8D:
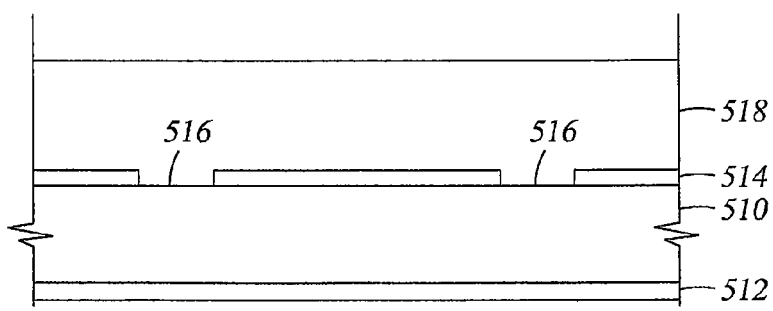
Figure 8E:
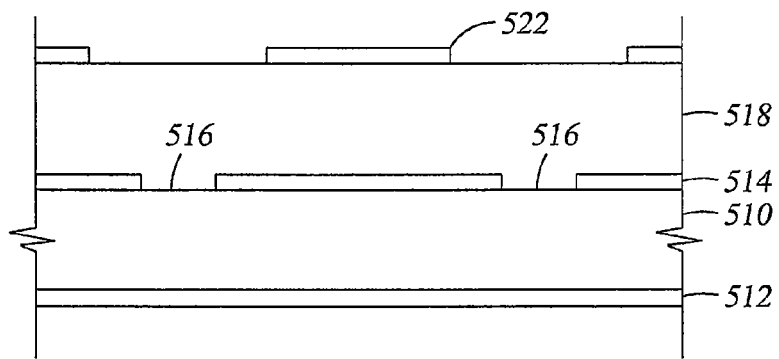
Figure 8F:
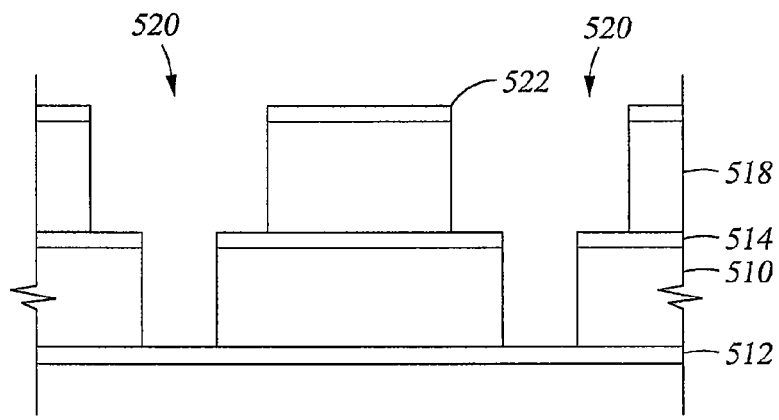
Figure 8G:
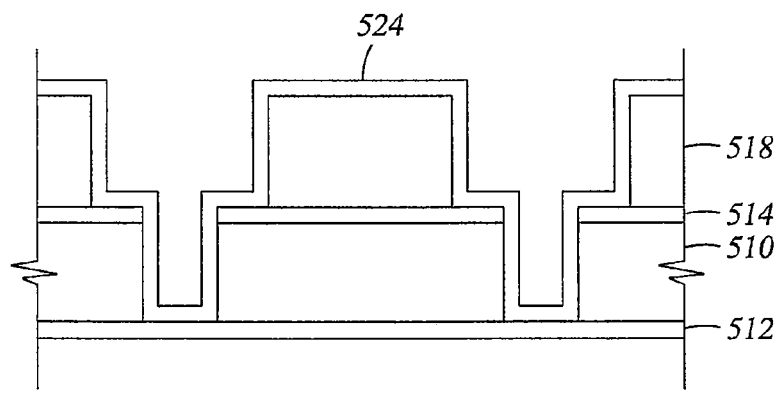
Figure 8H:
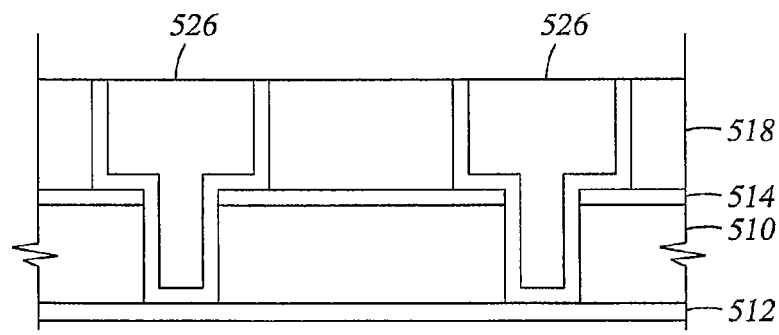

A preferred dual damascene structure fabricated in accordance with the invention includes a lining layer as shown in FIG. 8H, and the method of making the structure is sequentially depicted schematically in FIGS. 8A-8H, which are cross sectional views of a substrate having the steps of the invention formed thereon.

As shown in FIG. 8A, an initial first dielectric layer 510, such as parylene, FSG, silicon oxide, or the like, is deposited on the substrate 512 to a thickness of about 5,000 to about 10,000 Å, depending on the size of the structure to be fabricated. As shown in FIG. 8B, the low k etch stop 514, which is the oxidized organo silane layer, is then deposited on the first dielectric layer to a thickness of about 200 to about 1000 Å. Low k etch stop 514 is then pattern etched to define the contact/via openings 516 and to expose first dielectric layer 510 in the areas where the contacts/vias are to be formed as shown in FIG. 8C. Preferably, low k etch stop 514 is pattern etched using conventional photolithography and etch processes using fluorine, carbon, and oxygen ions. After low k etch stop 514 has been etched to pattern the contacts/vias and the photo resist has been removed, a second dielectric layer 518 is deposited over etch stop 514 to a thickness of about 5,000 to about 10,000 Å as shown in FIG. 8D. A second dielectric layer 518 is then patterned to define interconnect lines 520, preferably using conventional photolithography processes with a photo resist layer 522 as shown in FIG. 8E. The interconnects and contacts/vias are then etched using reactive ion etching or other anisotropic etching techniques to define the metallization structure (i.e., the interconnect and contact/via) as shown in FIG. 8F. Any photo resist or other material used to pattern the etch stop 514 or the second dielectric layer 518 is removed using an oxygen strip or other suitable process.

The metallization structure is then formed with a conductive material such as aluminum, copper, tungsten or combinations thereof. Presently, the trend is to use copper to form the smaller features due to the low resistivity of copper (1.7 µΩ-cm compared to 3.1 µΩ-cm for aluminum). Preferably, as shown in FIG. 8G, a barrier layer 524 of the oxidized organo silane material, or other suitable barrier is first deposited conformally in the metallization pattern to prevent copper migration into the surrounding silicon and/or dielectric material. Thereafter, copper is deposited using either chemical vapor deposition, physical vapor deposition, electroplating, or combinations thereof to form the conductive structure. Once the structure has been filled with copper or other metal, the surface is planarized using chemical mechanical polishing, as shown in FIG. 8H.

Deposition of Adhesive Layers

Figure 9:
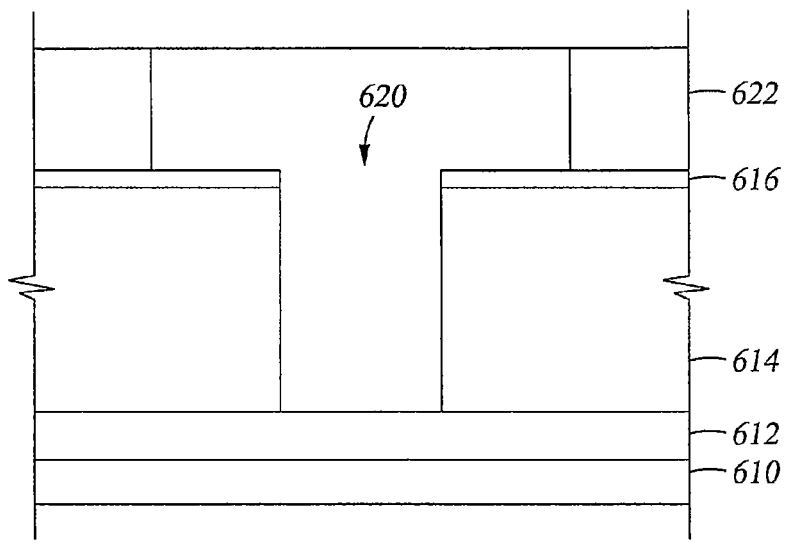
FIG. 9 is a cross sectional view showing an adhesive layer comprising the low k dielectric layers of the present invention between a premetal dielectric layer and an intermetal dielectric layer.

A dual damascene structure which includes an oxidized organo silane layer as an adhesive layer between a premetal dielectric layer and an intermetal dielectric layer is shown in FIG. 9. The oxidized organo silane adhesive layer 612 is deposited on a premetal dielectric layer 610 such as a conventional PSG or BPSG layer. An intermetal dielectric layer 614, preferably a low k dielectric polymer layer, is then deposited over the adhesive layer 612. A conventional silicon oxide or silicon nitride etch stop 616 and then patterned by conventional methods to define vias 620. A second intermetal dielectric layer 622, preferably the low k dielectric polymer, is then deposited over the patterned etch stop and then patterned to define the interconnect lines. A single etch process is then performed to define the interconnects down to the etch stop and to etch the unprotected dielectric exposed by the patterned etch stop to define the contacts/vias prior to metallization.

Figure 10A:
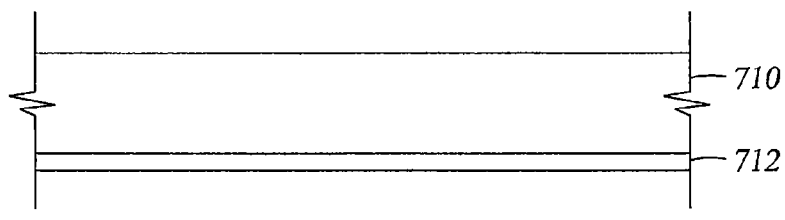
FIGS. 10A-10H are cross sectional views showing a dual damascene deposition sequence wherein the low k dielectric film of the present invention is used to adhere an intermetal dielectric film to a conventional etch stop.
Figure 10B:
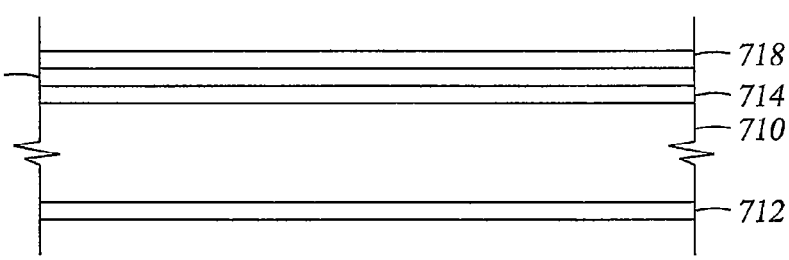
Figure 10C:
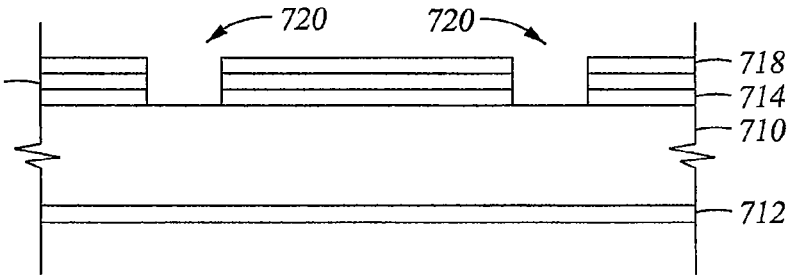
Figure 10D:
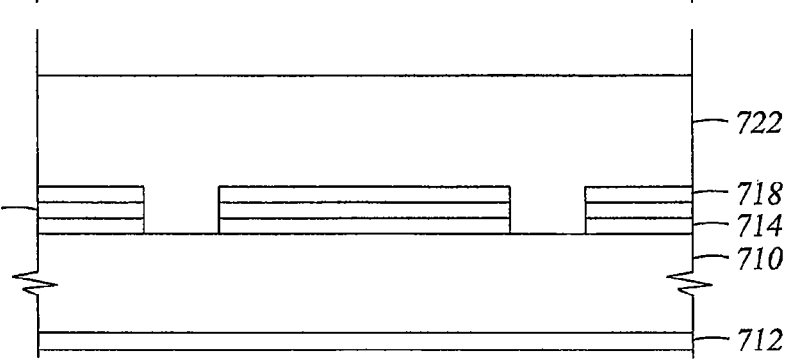
Figure 10E:
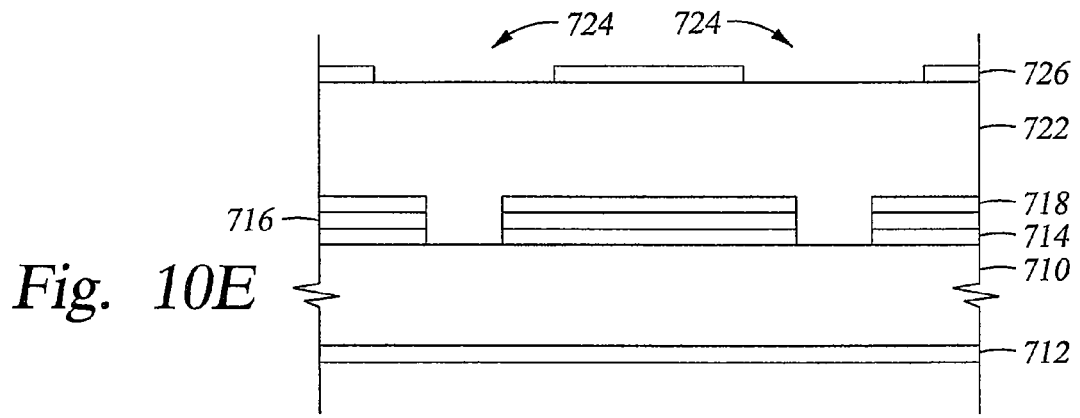
Figure 10F:
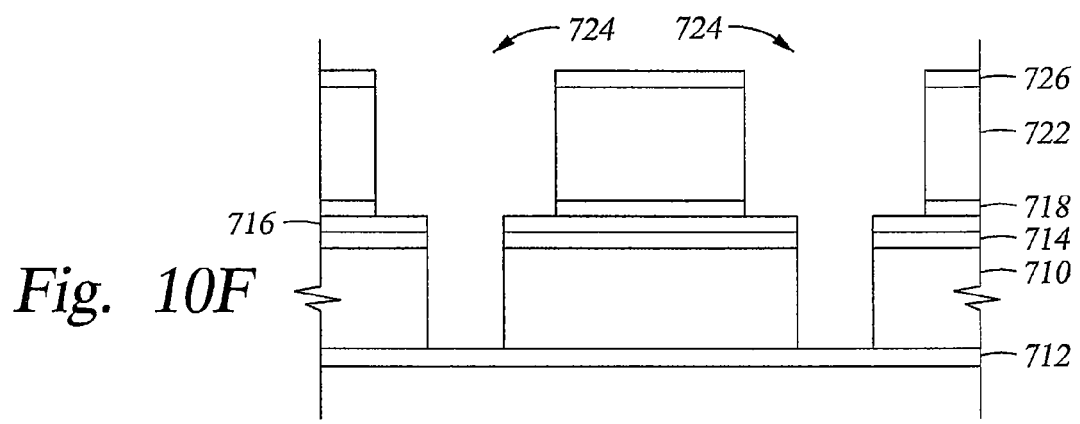
Figure 10G:
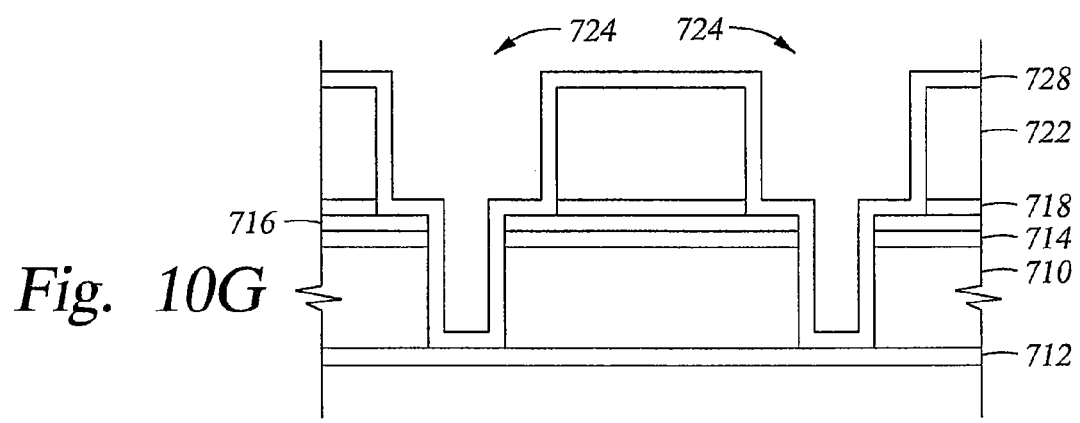
Figure 10H:
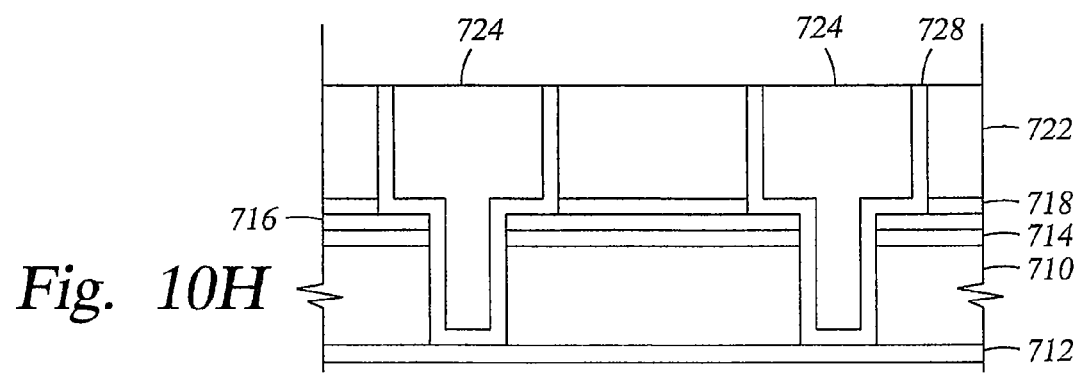

A preferred dual damascene structure comprising an adhesive layer in accordance with the invention is shown in FIG. 10H, and the method of making the structure is sequentially depicted schematically in FIGS. 10A-10H, which are cross sectional views of a substrate having the steps of the invention formed thereon.

As shown in FIG. 10A, an initial first intermetal dielectric layer 710, such as parylene, FSG, silicon oxide, or the like, is deposited on a substrate 712 to a thickness of about 5,000 to about 10,000 Å, depending on the size of the structure to be fabricated. As shown in FIG. 10B, a low k adhesive layer 714, which is the oxidized organo silane layer, is then deposited on the first intermetal dielectric layer 710 to a thickness of about 50 to about 200 Å. A conventional silicon oxide or silicon nitride etch stop 716 is the deposited on the adhesive layer 714 to a thickness of about 50 to about 200 Å. A second low k adhesive layer 718, which is the oxidized organo silane layer, is then deposited on the etch stop 716 to a thickness of about 50 to about 200 Å. The etch stop 716 and adhesive layers 714, 718 are then pattern etched to define the contact/via openings 720 and to expose first intermetal dielectric layer 710 in the areas where the contacts/vias are to be formed as shown in FIG. 10C. Preferably, the etch stop 716 is pattern etched using conventional photolithography and etch processes using fluorine, carbon, and oxygen ions. After the etch stop 716 and adhesive layers 714, 718 have been etched to pattern the contacts/vias and the photo resist has been removed, a second intermetal dielectric layer 722 is deposited over second adhesive layer 718 to a thickness of about 5,000 to about 10,000 Å as shown in FIG. 10D. The second intermetal dielectric layer 722 is then patterned to define interconnect lines 724, preferably using conventional photolithography processes with a photo resist layer 726 as shown in FIG. 10E. The interconnects and contacts/vias are then etched using reactive ion etching or other anisotropic etching techniques to define the metallization structure (i.e., the interconnect and contact/via) as shown in FIG. 10F. Any photo resist or other material used to pattern the etch stop 716 or the second intermetal dielectric layer 722 is removed using an oxygen strip or other suitable process.

The metallization structure is then formed with a conductive material such as aluminum, copper, tungsten or combinations thereof. Presently, the trend is to use copper to form the smaller features due to the low resistivity of copper (1.7 μΩ-cm compared to 3.1 μΩ-cm for aluminum). Preferably, as shown in FIG. 10G, a barrier layer 728 of the oxidized organo silane material, or other suitable barrier is first deposited conformally in the metallization pattern to prevent copper migration into the surrounding silicon and/or dielectric material. Thereafter, copper is deposited using either chemical vapor deposition, physical vapor deposition, electroplating, or combinations thereof to form the conductive structure. Once the structure has been filled with copper or other metal, the surface is planarized using chemical mechanical polishing, as shown in FIG. 10H.

The invention is further described by the following example of a deposited methyl silane film.

EXAMPLE

The following example demonstrates deposition of an oxidized organo silane film having excellent barrier and adhesion properties. This example was undertaken using a chemical vapor deposition chamber, and in particular, a CENTURA DxZ™ system which includes a solid-state RF matching unit with a two-piece quartz process kit, both fabricated and sold by Applied Materials, Inc., Santa Clara, Calif.

An oxidized methyl silane film was deposited at a chamber pressure of 3.0 Torr and temperature of 0° C. from reactive gases which were flown into the reactor as follows:

| | |
|---|---|
| Methyl silane, CH$_3$SiH$_3$, at | 55 sccm |
| Nitrous oxide, N$_2$O, at | 300 sccm |
| Helium, He, at | 4000 sccm. |

The substrate was positioned 600 mil from the gas distribution showerhead and 80 W of high frequency power (13 MHz) was applied to the showerhead for plasma enhanced deposition of an oxidized methyl silane layer.

The oxidized methyl silane material was deposited at a rate of 1800 Å. The deposited film had a dielectric constant of 3.0 and a refractive index of 1.44. The film had a measured tensile stress of 0.8×10$^9$ dynes/cm$^2$.

While the foregoing is directed to a preferred embodiment of the present invention, other and further embodiments of the invention may be devised without departing from the basic scope thereof, and the scope thereof is determined by the claims which follow.

What is claimed is:

1. A method for forming an integrated circuit structure, comprising:
   depositing one or more layers, wherein at least one layer comprises a low dielectric constant material comprising silicon, oxygen, and carbon;
   defining openings in the one or more layers;
   lining the openings with a dielectric material comprising silicon, oxygen, and carbon; and
   filling the openings with a conductive material.

2. A method for forming an integrated circuit structure, comprising:
   depositing a plurality of conformal layers, wherein at least one conformal layer comprises a low dielectric constant material comprising silicon, oxygen, and carbon;
   defining contact/via openings in the plurality of conformal layers;
   lining the contact/via openings with a dielectric material comprising silicon, oxygen, and carbon; and
   filling the contact/via openings with a conductive material.

3. A method for forming an integrated circuit structure, comprising:
   depositing one or more layers, wherein at least one layer comprises a low dielectric constant material deposited by oxidizing an organo silane compound having the general structure

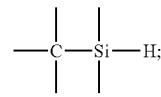

defining openings in the one or more layers;
   lining the openings with a dielectric material comprising silicon, oxygen, and carbon; and
   filling the openings with a conductive material.

4. The method of claim 3, wherein the organo silane compound has the structure SiH$_a$(CH$_3$)$_b$(C$_2$H$_5$)$_c$(C$_6$H$_5$)$_d$, where a=1 to 3, b=0 to 3, c=0 to 3, d=0 to 3, and a+b+c+d=4, or the structure Si$_2$H$_e$(CH$_3$)$_f$(C$_2$H$_5$)$_g$(C$_6$H$_5$)$_h$, where e=1 to 5, f=0 to 5, g=0 to 5, h=0 to 5, and e+f+g+h=6.

5. The method of claim 3, wherein the organo silane compound has the structure SiH$_n$(CH$_3$)$_{4-n}$, where n=1 to 3, or the structure Si$_2$H$_m$(CH$_3$)$_{6-m}$, where m=1 to 5.

6. The method of claim 3, wherein the organo silane compound is methyl silane.

* * * * *

UNITED STATES PATENT AND TRADEMARK OFFICE
CERTIFICATE OF CORRECTION

PATENT NO. : 7,651,725 B2  Page 1 of 1
APPLICATION NO. : 11/923037
DATED : January 26, 2010
INVENTOR(S) : Yau et al.

It is certified that error appears in the above-identified patent and that said Letters Patent is hereby corrected as shown below:

In the Background of the Disclosure:

Column 2, Line 43, please delete "pa" and insert --a-- therefor;

In the Description of a Preferred Embodiment:

Column 10, Line 53, please delete "Ipm" and insert --lpm-- therefor.

Signed and Sealed this

Sixth Day of April, 2010

David J. Kappos
*Director of the United States Patent and Trademark Office*